United States Patent

Yeol et al.

[11] Patent Number: 6,039,815
[45] Date of Patent: Mar. 21, 2000

[54] CLEANING METHOD AND APPARATUS FOR THE SAME

[75] Inventors: Oh Eui Yeol; Kenichi Mitsumori; Satoshi Miyazawa, all of Miyagi-ken, Japan

[73] Assignee: Alps Electric Co., Ltd., Japan

[21] Appl. No.: 08/829,701

[22] Filed: Mar. 26, 1997

[30] Foreign Application Priority Data

Mar. 27, 1996 [JP] Japan .................................. 8-072175

[51] Int. Cl.$^7$ ............................. C03C 23/00; B08B 3/00
[52] U.S. Cl. ................................... 134/2; 134/1; 134/1.3; 134/3; 134/26; 134/28; 134/29; 134/902
[58] Field of Search ................ 134/2, 3, 1.3, 1, 134/26, 28, 29, 902

[56] References Cited

U.S. PATENT DOCUMENTS

| | | | |
|---|---|---|---|
| 5,190,627 | 3/1993 | Saito et al. | 204/158.2 |
| 5,599,438 | 2/1997 | Shiramizu et al. | 205/746 |
| 5,616,221 | 4/1997 | Aoki et al. | 204/252 |
| 5,635,053 | 6/1997 | Aoki et al. | 205/746 |
| 5,676,760 | 10/1997 | Aoki et al. | 134/1.3 |
| 5,806,126 | 9/1998 | Larios et al. | 15/102 |

FOREIGN PATENT DOCUMENTS 6-260480  9/1994  Japan .
2294590  1/1996  United Kingdom .

OTHER PUBLICATIONS

Yagi et al, Advanced Ultrapure Water System with Low Dissolved Oxygen for Native Oxide Free Wafer Processing, IEEE Transactions on Semicondcutor Manufacturing, vol. 5, No. 2, pp. 121–127, May 1992.

Handbook of Semiconductor Wafer Cleaning Technology, Noyes Publications, pp. 48–59 and 119–128, 1993.

*Primary Examiner*—Randy Gulakowski
*Assistant Examiner*—Alexander Markoff
*Attorney, Agent, or Firm*—Brinks Hofer Gilson & Lione

[57] ABSTRACT

An aqueous oxidizing acidic cleaning solution or an aqueous oxidizing alkaline cleaning solution is produced by mixing an acidic or alkaline solution with ozone water. An aqueous reducing acidic cleaning solution or an aqueous reducing alkaline cleaning solution is produced by mixing an acidic or alkaline solution with hydrogen water. Each of these aqueous cleaning solutions has effective cleaning power and the ORP and pH values thereof are separately controlled. Therefore, by selecting an appropriate aqueous cleaning solution according to the types of contaminants adhering to subjects during each manufacturing step, a plurality of types of contaminants can be removed by washing with one type of aqueous cleaning solution.

7 Claims, 5 Drawing Sheets

CLEANING METHOD AND APPARATUS FOR THE SAME

BACKGROUND OF THE INVENTION

1. Field of the Invention

The present invention relates to a cleaning method employed for removing contaminants adhering to surfaces of substrates and the like during processes for manufacturing liquid crystal display substrates or semiconductors, and also relates to an apparatus for such method.

2. Description of the Related Art

A process for manufacturing a liquid crystal display substrate includes: a step for forming a metallic film (conductive film) by sputtering a metal such as ITO to the substrate surface; a step for forming electrodes by partially removing the metallic film (conductive film) by etching after forming a resist layer on the metallic film; and a step for forming an orientation film on the electrode made of the metallic film (conductive film). A process for manufacturing a liquid crystal display substrate employing TFT includes: a step for forming a metallic film (conductive films) by sputtering or CVD to form TFT; a step for coating a resist layer; and a step for partially removing the metallic film by etching.

During the above manufacturing steps, particles in the air may adhere to the substrate surface, metal or organic substances may also adhere during etching or resist-layer forming, and an oxide film may be spontaneously formed over the substrate surface. If these contaminants adhere to substrates, electrodes, or the interfaces between electrodes and the orientation film, contact between electrodes deteriorates, thereby increasing resistance and also causing inferior wiring. Therefore, steps for removing these contaminants are significantly important in order to produce high performance elements, and the substrate surface must be cleaned at every manufacturing step. In particular, reliable cleaning is necessary for a TFT forming step in which each metallic film must be layered on a highly clean interface.

An aqueous acidic cleaning solution containing, e.g., HCl or $H_2SO_4$, or an aqueous alkaline cleaning solution containing, e. g., $NH_4OH$, are employed for conventional cleaning steps. Particles are washed away with an acidic solution and metal and organic substances are washed away with an alkaline solution. Oxide films can be removed by hydrofluoric acid.

Although cleaning power is strengthened by increasing the concentration of the alkaline or acid solution, an exceedingly high concentration causes damage on the substrate surface or corrodes electrodes formed on the surface. Moreover, the type of contaminants adhering to a substrate during each manufacturing step differs from step to step, and one type of aqueous cleaning solution can remove only one type of contaminant. Therefore a separate cleaning procedure using an exclusive cleaning solution is necessary for each step. For example, in a cleaning step after electrode forming, at least two types of solutions, i. e., an acidic solution and an alkaline solution, must be separately applied to a substrate surface to remove metal and particles adhering to the surface. Thus, an inefficiently longer time is required for the cleaning step. In addition, since each cleaning step is conducted in a clean room to prevent contaminants in the air from adhering to substrates, a separate cleaning chamber must be prepared for each aqueous cleaning solution. Consequently, when a plurality of aqueous cleaning solutions are used corresponding to a plurality of cleaning procedures, a corresponding number of cleaning chambers are required, thereby increasing the size of cleaning apparatuses and equipment cost.

To solve the above problem, super-pure water alone or in combination with ultrasonic-waves is employed for the cleaning step in TFT-LCD substrate manufacturing, instead of the above acidic or alkaline solution. Super-pure water is highly purified such that micro-particles, colloidal microorganisms, organic substances, metal, ions, dissolved oxygen and the like are removed to extremely low concentrations by membrane equipment such as ultrafiltration membrane and reverse osmosis membrane, ion-exchange equipment, ultraviolet irradiation equipment, and the like. By the use of super-pure water, substrates or electrodes will not corrode during the cleaning step, and furthermore, no contaminants are derived from super-pure water.

However, super-pure water has low cleaning power and is not efficient in the removal of contaminants. In addition, super-pure water cannot removed certain types of contaminants from the substrate surface. Therefore, to clean a substrate using super-pure water, for example, the following procedures are required: the substrate surface is exposed to ultraviolet irradiation in the presence of ozone to remove organic substances, brushed for removing large particles, washed with super-pure water in combination with ultrasonic-waves to remove small particles, and then washed with super-pure water.

Since the cleaning step is divided into several procedures, as is above described, a plurality of cleaning chambers must be prepared. Moreover, since the cleaning step is carried out for a long period of time while using a large quantity of super-pure water, lower cost of manufacturing substrates cannot be achieved.

In addition, the substrate is transferred from chamber to chamber according to the above cleaning step, therefore contaminants may re-adhere to the substrate during the transfer procedure. Furthermore, since metal cannot be removed by washing with super-pure water, adhesion of metallic impurities is unavoidable, resulting in insufficient cleaning.

SUMMARY OF THE INVENTION

Accordingly, it is an object of the present invention to provide a wet-cleaning method, in which an appropriate aqueous cleaning solution corresponding to the types of contaminants adhering to substrates during each manufacturing step is produced so that a plurality of types of contaminants can be removed using one type of aqueous cleaning solution, and an apparatus used for such method.

To achieve the above object, the present invention provide a method of cleaning a subject with an aqueous oxidizing alkaline solution and a method of cleaning a subject with an aqueous reducing acidic cleaning solution. The aqueous oxidizing alkaline cleaning solution is prepared by mixing ozone water and an alkaline solution and the aqueous oxidizing alkaline cleaning solution is prepared by mixing hydrogen water and an acidic solution.

According to the present invention, ozone water is utilized for providing oxidizing property and hydrogen water is used for providing reducing property for aqueous cleaning solutions. In a cleaning method of the present invention, a subject is washed with an aqueous oxidizing acidic cleaning solution prepared by mixing ozone water and an acidic solution. In another cleaning method of the present invention, a subject is washed with an aqueous reducing alkaline cleaning solution prepared by mixing hydrogen water and an alkaline solution.

Furthermore, a cleaning method of the present invention comprises: a step for selectively producing ozone water or hydrogen water by dissolving ozone gas or hydrogen gas, respectively, in pure water; a step for producing an aqueous oxidizing acidic or alkaline cleaning solution by selectively mixing an acidic or alkaline solution with ozone water, or selectively producing an aqueous reducing acidic or alkaline cleaning solution by selectively mixing an acidic or alkaline solution with hydrogen water; and a step for washing a subject with any one of the above four types of cleaning solutions.

A cleaning apparatus of the present invention comprises: a section for producing an aqueous cleaning solution selected from an aqueous oxidizing acidic cleaning solution, an aqueous oxidizing alkaline cleaning solution, an aqueous reducing acidic cleaning solution, and an aqueous reducing alkaline cleaning solution; and a cleaning chamber to which one of the above aqueous cleaning solutions produced by the section is selectively supplied.

In the above cleaning apparatus, the section for producing a cleaning solution comprises: an ozone-gas producing apparatus and a hydrogen gas producing apparatus; a mixing apparatus for dissolving ozone gas or hydrogen gas in pure water to produce ozone water or hydrogen water, respectively; and a mixing apparatus for mixing an acidic or alkaline solution with either of ozone water or hydrogen water.

Ozone gas and hydrogen gas are produced by, for example, electrolysis. Therefore, the same electrolytic cell can be used for generating ozone gas and hydrogen gas. In addition, ozone gas may be produced by a silent discharge method. The resulting ozone gas and hydrogen gas are dissolved in water according to a bubble-tower method, a packed-tower method, or the like.

According to the present invention, liquid crystal display substrates used in liquid crystal display devices, in particular, liquid crystal display substrates provided with a TFT for each pixel, are employed as cleaning subjects. However, electronic parts such as semiconductor elements or integrated circuits can be used as the cleaning subjects.

Examples of cleaning methods are: a batch cleaning method in which subjects are immersed in an aqueous cleaning solution; a method in which an aqueous cleaning solution is applied to subjects by showering or jetting; a spin cleaning method in which a subject is rotated at a high speed while applying an aqueous cleaning solution to the center of rotation; and a flow cleaning method in which an aqueous cleaning solution flows down a subject. In addition, the cleaning efficacy can be improved by combining the above methods with ultrasonic-waves or ultraviolet irradiation.

According to the present invention, an aqueous oxidizing alkaline cleaning solution, an aqueous reducing acidic cleaning solution, an aqueous oxidizing acidic cleaning solution containing ozone water, and an aqueous reducing alkaline cleaning solution containing hydrogen water exhibit excellent cleaning power corresponding to the type of contaminants. Therefore by selectively applying the above aqueous cleaning solutions to processes for manufacturing LCD substrates or the like, contaminants adhering to subjects can be removed using a small quantity of aqueous cleaning solution in a short period of time.

The subjects must be cleaned after each manufacturing step. An aqueous cleaning solution capable of removing a plurality of contaminant types adhering to the subjects during each manufacturing step can be prepared according to the present invention because the pH and oxidation-reduction potential (ORP) of the aqueous cleaning solution are separately adjustable to avoid damaging the subjects. Therefore, a plurality of contaminant types adhering to the subjects can be removed by using only one type of aqueous cleaning solution.

As a result, the number of cleaning chambers and the period of time required for cleaning steps can be reduced. For example, when manufacturing liquid crystal display substrates, the following apparatuses can be connected to the cleaning chambers: a film-forming apparatus such as a sputtering or CVD (chemical vapor deposition) apparatus, a coating apparatus for forming orientation films or resist layers from organic materials, and an assembling apparatus for liquid crystal display cells in which liquid crystal display substrates are assembled with spacers therebetween. Therefore, subjects can be transferred to the film-forming step, coating step, or the like immediately after cleaning so that re-adhesion of contaminants is avoidable.

As is mentioned in the above, according to the present invention, a plurality of contaminant types can be removed using only one type of aqueous cleaning solution. Furthermore, since an appropriate aqueous cleaning solution is selectable according to the types of contaminants, cleaning apparatuses can be simplified and cleaning time can be shortened, thereby reducing the cost of manufacturing liquid crystal display cells and the like.

DESCRIPTION OF THE PREFERRED EMBODIMENT

The present invention will be described in detail with reference to attached drawings.

Figure 1A:
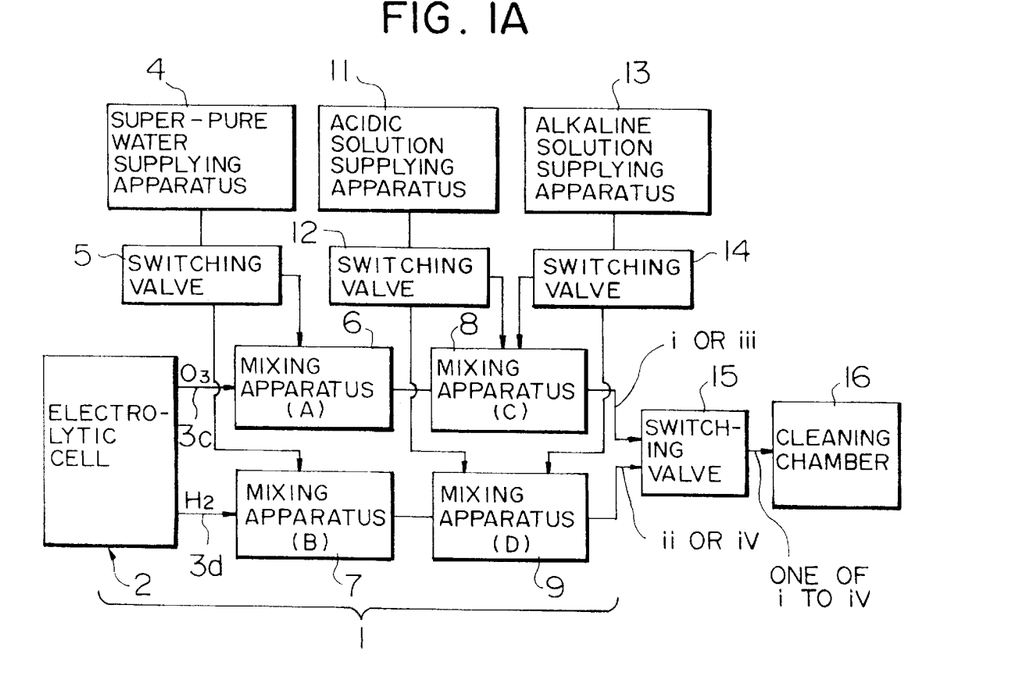
FIG. 1A shows a construction of a cleaning apparatus incorporated in the present invention.
Figure 1B:
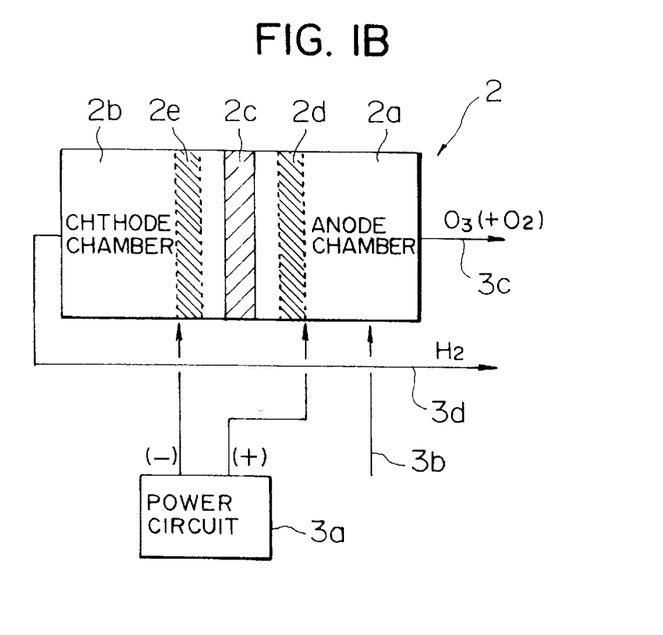
FIG. 1B shows an electrolytic cell provided for the cleaning apparatus shown in FIG. 1A.

FIG. 1A shows a cleaning apparatus A as an example incorporated in the present invention. The cleaning apparatus A includes a section (production apparatus) 1 for producing aqueous cleaning solutions and a cleaning chamber 16. FIG. 1B shows an electrolytic cell 2 provided for the section 1. The electrolytic cell 2 generates ozone gas and hydrogen gas.

As is shown in FIG. 1B, the electrolytic cell 2 includes an anode chamber 2a, a cathode chamber 2b, an ion-exchange membrane 2c which is positioned in the center of the cell, a catalyst 2d for the anode chamber 2a, and a catalyst 2e for the cathode chamber 2b. Ion-exchanged water is supplied to each chamber from an ion-exchange tower (not shown in the figure) via an introducing conduit 3b. From a power circuit 3a, dc current is applied to electrodes of the anode chamber 2a and the cathode chamber 2b. Ozone ($O_3$) generated in the anode chamber 2a by electrolysis is discharged from a supplying conduit 3c with a small quantity of oxygen gas ($O_2$). Hydrogen gas ($H_2$) generated in the cathode chamber 2b is discharged from a supplying conduit 3d.

A super-pure water supplying apparatus 4 supplies highly purified water such that micro-particles, colloidal microorganisms, organic substances, metal, ions, dissolved oxygen, and the like are removed to extremely low concentrations by membrane equipment such as ultrafiltration membrane or reverse osmosis membrane equipment, ion-exchange equipment, ultraviolet irradiation equipment, and the like. From the super-pure water supplying apparatus 4, super-pure water is selectively supplied to a mixing apparatus (A) 6 or a mixing apparatus (B) 7 by a switching valve 5. In the mixing apparatus (A) 6, ozone water is produced such that super-pure water flowing in a conduit at a predetermined flow rate is mixed with ozone gas supplied from the supplying conduit 3c. Similarly, in the mixing apparatus (B) 7, hydrogen water is produced such that super-pure water flowing in a conduit is mixed with hydrogen gas.

The mixing apparatus (A) 6 connects to a mixing apparatus (C) 8, and the mixing apparatus (B) 7 connects to a mixing apparatus (D) 9. An acidic chemical solution is selectively supplied to the mixing apparatus (C) 8 or (D) 9 by a switching valve 12 from an acidic-solution supplying apparatus 11. An alkaline chemical solution is selectively supplied to the mixing apparatus (C) 8 or (D) 9 by a switching valve 14 from an alkaline-solution supplying apparatus 13.

Examples of the acidic solution supplied from the acidic-solution supplying apparatus 11 are HCl (hydrochloric acid), HF (hydrofluoric acid), $HNO_3$ (nitric acid), and $H_2SO_4$ (sulfuric acid). Examples of the alkaline solution supplied from the alkaline-solution supplying apparatus 13 are $NH_4OH$ (ammonium hydroxide), KOH (potassium hydroxide), and NaOH (sodium hydroxide).

When an acidic solution such as HF, $HNO_3$, or $H_2SO_4$ is mixed with ozone water in the mixing apparatus (C) 8, an aqueous oxidizing acidic cleaning solution (i) is produced, meanwhile an aqueous oxidizing alkaline cleaning solution (iii) is produced when an alkaline solution such as $NH_4OH$, KOH, or NaOH is mixed with ozone water.

When an alkaline solution such as $NH_4OH$, KOH, or NaOH is mixed with hydrogen water in the mixing apparatus (D) 9, an aqueous reducing alkaline cleaning solution (ii) is produced, meanwhile an aqueous reducing acidic cleaning solution (iv) is produced when an acidic solution such as HF, $HNO_3$, or $H_2SO_4$ is mixed with hydrogen water.

The aqueous cleaning solution (i) or (iii) supplied from the mixing apparatus (C) 8 or the aqueous cleaning solution (ii) or (iv) supplied from the mixing apparatus (D) 9 is selectively supplied to the cleaning chamber 16 by a switching valve 15. In the cleaning chamber 16, subjects such as liquid crystal display substrates are washed with one of the aqueous cleaning solutions (i) to (iv). In other words, one of the aqueous cleaning solutions (i) to (iv) is selectively produced in the section 1 and transferred to the cleaning chamber 16.

Furthermore, in apparatus (C) 8 or (D) 9 of the section 1, the ORP and pH of each aqueous cleaning solution can be set to optional values by controlling the concentration of the acidic or alkaline solution or ozone or hydrogen water, or mixing ratio thereof. Therefore, it is possible to regulate the cleaning power of each aqueous cleaning solution according to the types of contaminants adhering to, for example, liquid crystal display substrates during each manufacturing step.

Figure 2:
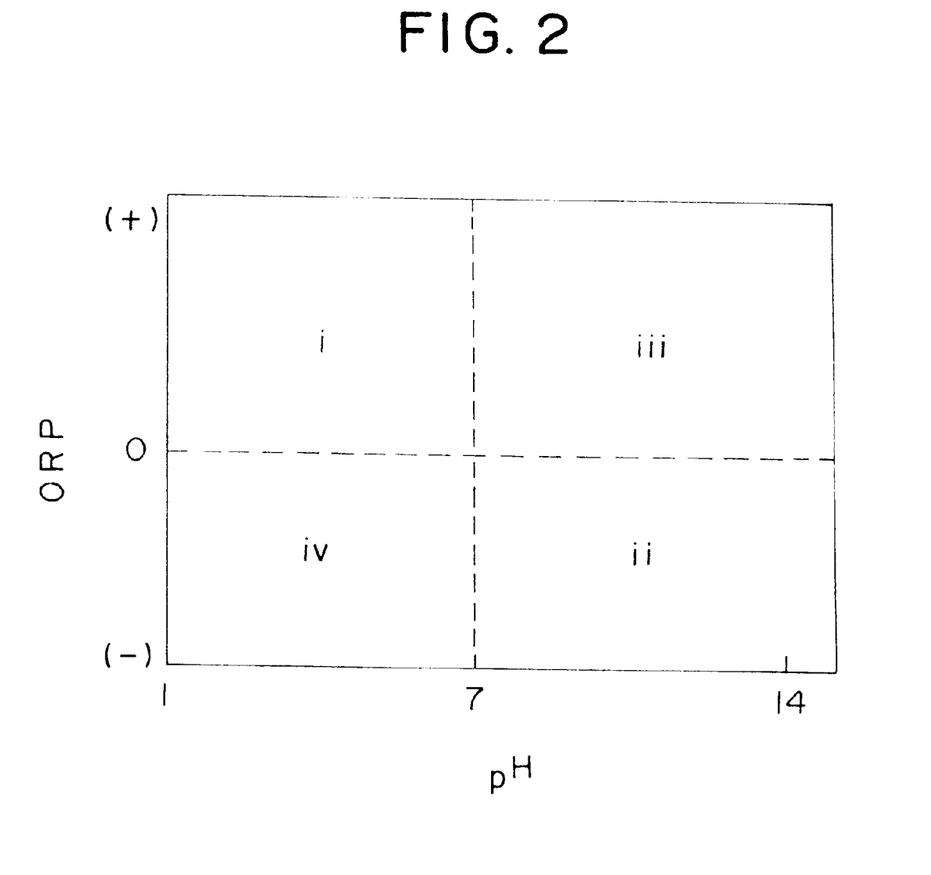
FIG. 2 shows distribution region of the oxidation-reduction potential (ORP) and pH of each of aqueous cleaning solutions (i) to (iv)

In FIG. 2, the abscissa indicates the hydrogen ion concentration (pH) and the ordinate shows the ORP. The aqueous oxidizing acidic cleaning solution is in region (i), the aqueous reducing alkaline cleaning solution is in region (ii), the aqueous oxidizing alkaline cleaning solution is in region (iii), and the aqueous reducing acidic cleaning solution is in region (iv). By regulating the concentration of the acidic or alkaline solution or ozone or hydrogen water, or mixing ratio of the solution to water, the pH and ORP of the aqueous cleaning solutions (i) to (iv) can be altered within the corresponding regions separated by dotted lines (i. e., line of pH 7 and line of ORP=0) in FIG. 2. The cleaning power of each aqueous cleaning solution is thereby adjustable.

Examples of cleaning methods for subjects in the cleaning chamber 16 are: a batch cleaning method in which subjects are immersed in an aqueous cleaning solution; a method in which an aqueous cleaning solution is applied to subjects by showering or jetting; a spin cleaning method in which a subject is rotated at a high speed while applying an aqueous cleaning solution to the center of rotation; and a flow cleaning method in which an aqueous cleaning solution flows down a subject. In addition, the cleaning efficacy can be improved by combining the above methods with ultrasonic-waves or ultraviolet irradiation.

Figure 3A:
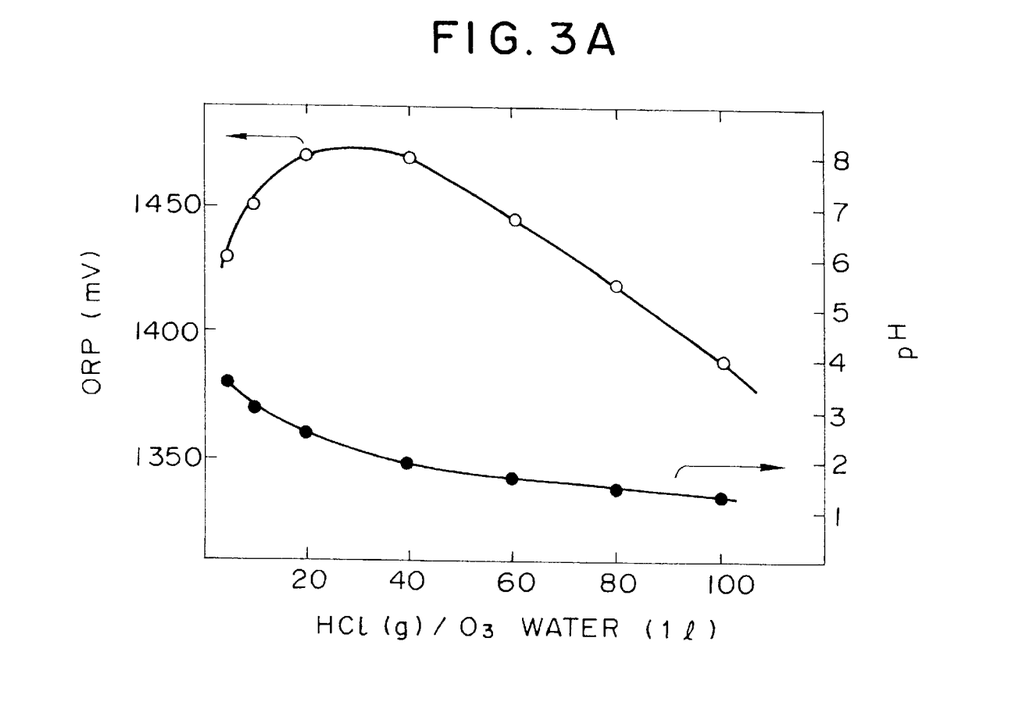
FIG. 3A shows the relationship between ORP, pH, and the mixing ratio of HCl to ozone water in the aqueous cleaning solution (i)

FIG. 3A shows the relationship between ORP, pH, and the mixing ratio of an acidic solution to ozone water. In other words, FIG. 3 is a graph showing the relationship between ORP, pH, and the mixing ratio of acidic solution to ozone water in the aqueous oxidizing acidic cleaning solution (i). For comparison, FIG. 3B shows the relationship between ORP, pH, and the mixture ratio of an acidic solution to super-pure water ($H_2O$).

The results shown in FIG. 3 were obtained such that by altering the volume of HCl solution mixed with ozone water having a concentration of 6 to 10 PPM, the ORP and pH of the resulting aqueous cleaning solution (i) having various ozone concentrations were measured by an ORP sensor and a pH sensor. The abscissa indicates the quantity (gram) of HCl with respect to 1 liter of ozone water and the ordinate shows the ORP (mV) and pH values. In FIG. 3, ○ and ● indicate ORP (mV) and pH, respectively. It is found from the graph that oxidizing power increases corresponding to a rise in ORP.

When the mixed quantity of HCl is altered from 5 g to 100 g in the graph, the pH and ORP change from 4 to 2 and from 1390 mV to 1470 mV, respectively. When the mixed quantity of HCl is 30 g, the ORP reaches its maximum value, i. e., 1470 mV.

Figure 3B:
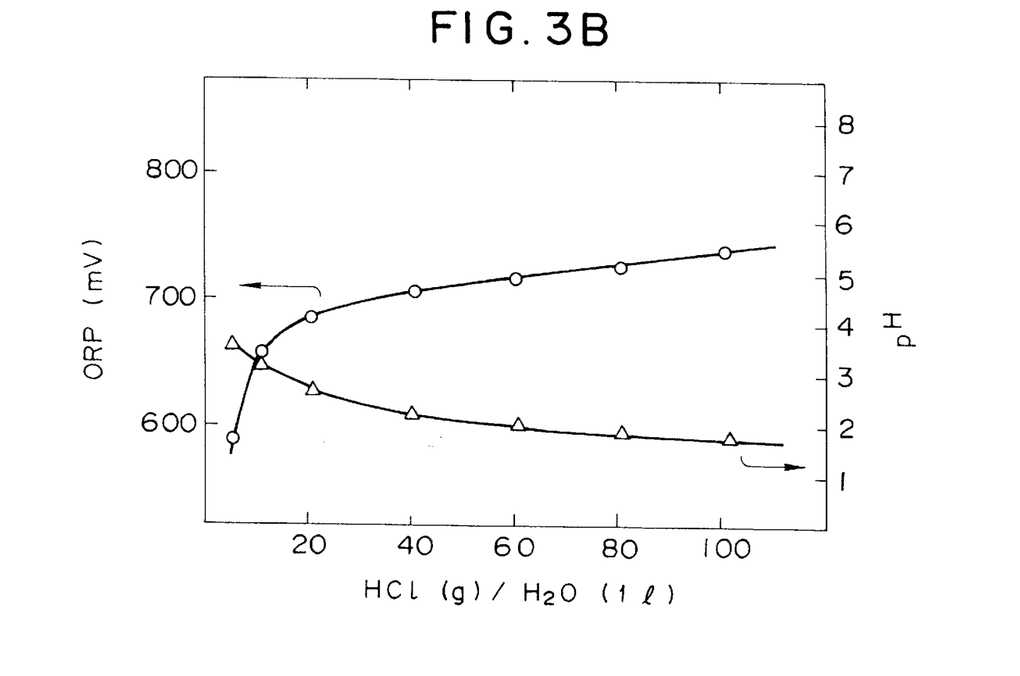
FIG. 3B shows the relationship between ORP, pH, and the mixture ratio of HCl to super-pure water ($H_2O$)

Compared with FIG. 3A, the abscissa of FIG. 3B indicates the mixed quantity (gram) of HCl with respect to 1 liter of super-pure water and the ordinate shows the ORP (mV) and pH. The ORP (mV) and pH are indicated by ○ and Δ, respectively. When the mixed quantity of HCl is altered from 5 g to 100 g in the graph of FIG. 3B, the pH and ORP change from 4 to 2 and from 580 mV to 730 mV, respectively.

As described above, when an acidic solution, i. e. a HCl solution, is mixed with super-pure water (FIG. 3B), changes in the pH of the resulting solution are similar to those obtained when an acidic solution, i. e. a HCl solution, is mixed with ozone water (FIG. 3A). Meanwhile, the ORP of the resulting solutions prepared using ozone water are higher than the solutions obtained using super-pure water; and the maximum value of the former shown in FIG. 3A is more than twice that of the latter (i. e., approximately 700 mV) shown in FIG. 3B. In other words, the solutions prepared using ozone water are acidic and highly oxidizing, resulting in strong cleaning power. It is understood from FIG. 3A that the preferred quantity of HCl mixed in ozone water having a concentration of 6 to 10 PPM is from 5 to 100 g to obtain an acidic and highly oxidizing cleaning solution.

It is apparent from FIG. 3A that the ORP and pH of the aqueous cleaning solution (i) prepared by mixing an acidic solution with ozone water can be controlled by changing the concentration of acidic solution with respect to ozone water or that of ozone water per se. For example, a reduction in pH, that is, an increase in acidity, is achieved by elevating the concentration of acid solution such as a HCl solution; and stronger oxidizing effect can be obtained by raising the concentration of ozone water. With respect to an aqueous cleaning water prepared by mixing the above acid solution and ozone water the concentrations of which have been changed, the ORP and pH are measured at various mixing ratios so as to obtain a mixing ratio giving appropriate ORP and pH values. As shown in FIG. 3A, the mixing ratio of HCl to ozone water having a concentration of 6 to 10 PPM is regulated in the range of from 5 to 100 g. Accordingly, an aqueous cleaning solution (i) having a strong cleaning effect corresponding to the types of contaminants adhering to subjects during each manufacturing step can be obtained by regulating the ORP and pH values.

Figure 4A:
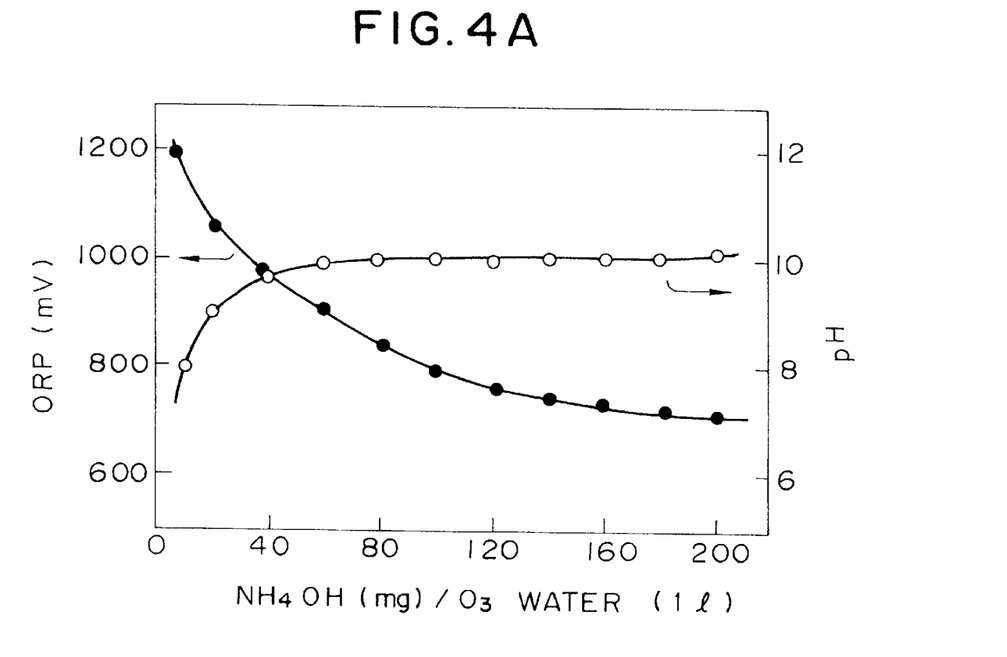
FIG. 4A shows the relationship between ORP, pH, and the mixing ratio of $NH_4OH$ to ozone water in the aqueous cleaning solution (iii)

FIG. 4A shows a similar relationship in the aqueous oxidizing alkaline cleaning solution (iii) containing ozone water. In other words, FIG. 4A is a graph showing the relationship between ORP, pH, and the mixing ratio of an alkaline solution to ozone water. For comparison, FIG. 4B shows the relationship between ORP, pH, and the mixing ratio of an alkaline solution to super-pure water ($H_2O$).

The results shown in FIG. 4A were obtained such that by altering the quantity (mg) of $NH_4OH$ mixed with one liter of ozone water having a concentration of 8 to 10 PPM, the ORP and pH values of the resulting aqueous cleaning solution (iii) were measured by an ORP sensor and a pH sensor. The abscissa of FIG. 4A indicates the quantity (mg) of $NH_4OH$ with respect to 1 liter of ozone water and the ordinate shows ORP (mV) and pH. Similar to FIG. 3A, ○ and • indicate ORP (mV) and pH, respectively.

When the mixed quantity of $NH_4OH$ alters from 10 to 200 mg in the graph of FIG. 4A, the pH and ORP values change from 8 to 10.2 and from 1200 mV to 700 mV, respectively. When the mixed quantity of $NH_4OH$ is 10 mg, the ORP value is 1200 mV.

Figure 4B:
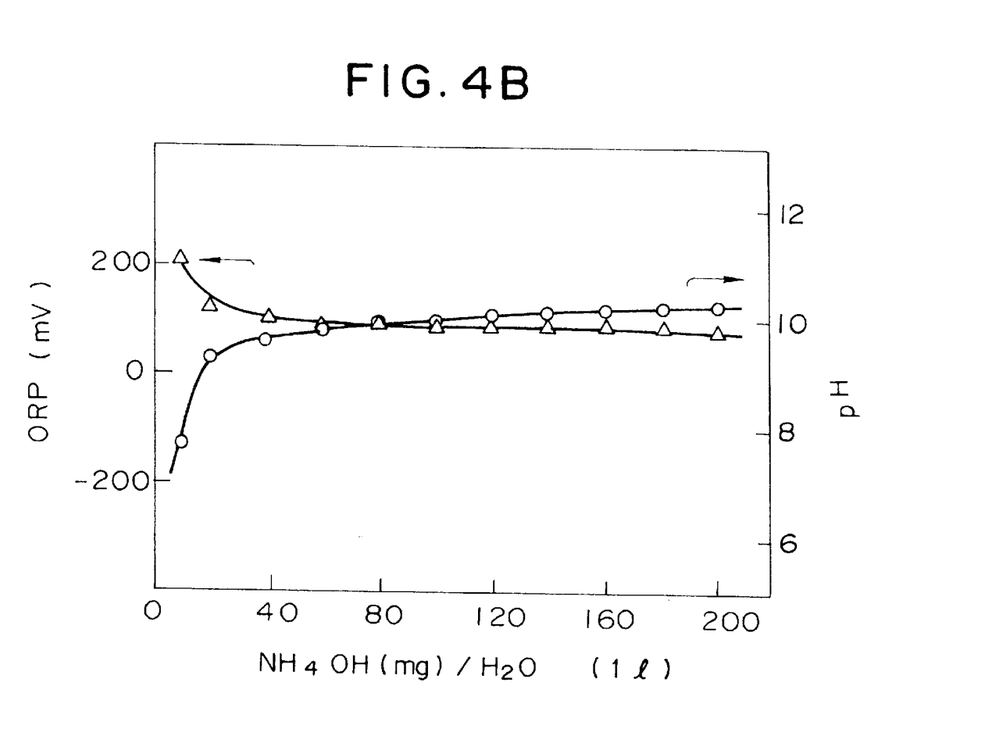
FIG. 4B shows the relationship between ORP, pH, and the mixture ratio of $NH_4OH$ to super-pure water ($H_2O$)

Compared with the above, the abscissa of FIG. 4B indicates the mixed quantity (mg) of $NH_4OH$ with respect to 1 liter of super-pure water and the ordinate shows ORP (mV) and pH . The ORP (mV) and pH values are indicated by ○ and Δ, respectively. When the mixed quantity of $NH_4OH$ alters from 10 mg to 200 mg in the graph of FIG. 4B, pH and ORP change from 8 to 10.5 and from 200 mV to 90 mV, respectively.

It is understood from FIGS. 4A and 4B that solutions obtained by mixing 10 to 200 of $NH_4OH$ with ozone water having a concentration of 8 to 10 shows similar pH values to those prepared by mixing the same quantity of $NH_4OH$ with super-pure water. Meanwhile, the ORP value of the former prepared using ozone water is 700 mV or more which value is approximately 3.5 times or more higher than the maximum ORP value of the latter (i. e., approximately 200 mV) obtained by using super-pure water. In other words, the aqueous cleaning solution (iii) prepared by mixing an alkaline solution with ozone water is alkaline and highly oxidizing, thereby showing stronger cleaning power as compared with those prepared using super-pure water.

When the $NH_4OH$ quantity is 40 mg, the line indicating the ORP value and that indicating the pH value cross each other at high ORP and pH values. Therefore, a highly alkaline aqueous cleaning solution being highly oxidizing can be obtained by mixing 40 mg of $NH_4OH$ with ozone water having a concentration of 8 to 10 PPM.

Furthermore, the ORP and pH of the aqueous cleaning solution (iii) can be controlled by changing the concentration of ozone water or alkaline solution. For example, a rise in the pH value, that is, an increase in alkalinity, is achieved by elevating the concentration of alkaline solution; and stronger oxidizing effect can be obtained by raising the concentration of ozone water. With respect to an aqueous cleaning water prepared by mixing the above alkaline solution and ozone water the concentrations of which have been changed, the ORP and pH are measured at various mixing ratios so as to obtain a mixing ratio giving appropriate ORP and pH values. It is understood from FIG. 4A that the preferred quantity of $NH_4OH$ mixed with ozone water having a concentration of 8 to 10 PPM is from 10 to 200 mg.

Similarly, in the case of the aqueous reducing alkaline cleaning solution (ii) or aqueous reducing acidic cleaning solution (iv) prepared using hydrogen water instead of ozone water, the ORP and pH values can be measured at various mixing ratios of alkaline solution or acid solution to hydrogen water. The ORP and pH values can be separately controlled by altering the concentrations of hydrogen water and alkaline or acidic solution. As is mentioned in the above, the most effective aqueous cleaning solution corresponding to the types of contaminants adhering to substrates during each manufacturing step can be selectively prepared because the ORP and pH values of the aqueous cleaning solutions (i) to (iv) are controllable by regulating the concentration of acid or alkaline solution, that of ozone or hydrogen water, or the mixing ratio thereof.

EXAMPLES

Examples of cleaning apparatuses and cleaning methods incorporated in the present invention and the results thereof will be described below.

Example 1

In this example, a liquid crystal display substrate was cleaned with the aqueous oxidizing acidic cleaning solution (i) and the removal effect on metal adhering to the substrate was evaluated.

In general, to form a TFT semiconductor for each pixel, a Cr film is sputtered on the surface of a liquid crystal display substrate and then removed by etching according to a certain pattern. Since the solution used for etching contains Ce (cerium) in addition to nitric acid, Ce atoms readily adhere to the substrate surface after etching. In the example 1, effects of the aqueous cleaning solution (i) on the Ce atom removal were studied based on the number of Ce atoms adhering to the substrate surface.

To evaluate the Ce atom removal, the number of Ce atoms adhering to 1 $cm^2$ of substrate surface was calculated from X-ray reflectance measured by a Total Reflection Fluorescent X-ray Spectrometer manufactured by Technos.

One liter of a 40 mmol/liter HCl solution was mixed with one liter of ozone water having an ozone concentration of 8 to 10 PPM and used as the aqueous oxidizing acidic cleaning solution (i) in the example 1.

In a comparative example, cleaning was carried out using only ozone water having a concentration of 8 to 10 PPM. In another comparative example, only a 40 mmol/liter HCl solution was used for cleaning.

Each cleaning solution was jetted on the surface of liquid crystal display substrate for 5 min. in the above example 1 and comparative examples.

<Effects on Ce Atom Removal>

It was confirmed that approximately $10^{14}/cm^2$ of Ce atoms adhered to the surface of the liquid crystal display substrate which had been etched with the above etching solution containing nitric acid and Ce, that is, the uncleaned substrate. The number of Ce atoms adhering to the substrate was approximately $10^{12}/cm^2$ in the comparative example in which the substrate had been cleaned with only ozone water having a concentration of 8 to 10 PPM. The number of Ce atoms adhering to a substrate was approximately $10^{13}/cm^2$ in another comparative example in which the substrate had been cleaned with only a 40 mmol/liter HCl solution. It was confirmed that the number of Ce atoms adhering to the substrate surface could be reduced to approximately $10^{10}/cm^2$ in example 1 by washing the substrate with the aqueous cleaning solution (i) prepared by mixing one liter of a 40 mmol/liter HCl solution with one liter of ozone water having an ozone concentration of 8 to 10 PPM.

It was understood from the above that a larger number of Ce atoms could be removed from the substrate surface in example 1, in which the substrate was washed with the aqueous cleaning solution (i), as compared with those in the comparative examples in which the substrate was washed with only ozone water or a HCl solution. In other words, metallic contaminants adhering to the substrate surface could be effectively removed by a method using the aqueous oxidizing acidic cleaning solution (i).

Example 2

In this example, organic substances on the surface of a liquid crystal display substrate were removed using the aqueous oxidizing acidic cleaning solution (i) having the same mixing ratio as in the example 1. In a comparative example, cleaning was carried out using only ozone water having a concentration of 8 to 10 PPM. In another comparative example, a 40 mmol/liter HCl solution was used for cleaning. Each cleaning solution was jetted on the substrate surface for 10 sec. in the above example 2 and comparative examples.

The liquid crystal display substrate was subjected to the above cleaning procedure immediately after removing a resist layer therefrom, and the removal of organic substances such as residues of the resist layer was investigated to evaluate the cleaning effect.

The effects on organic-substance removal were evaluated based on the degree of contact of water droplets adhering to the substrate surface, which degree of contact had been measured after washing and drying the substrates according to the corresponding cleaning methods of example 2 and comparative examples. When a small quantity of organic substance adheres to the substrate surface, the degree of contact of a water droplet is reduced due to an increase in the wettability by the water droplet with respect to the substrate surface.

<Effects on Organic-substance Removal>

The degree of contact of a water droplet on an uncleaned substrate surface was 20°. The degree of contact was 10° in a comparative example in which the substrate surface was cleaned with only ozone water having a concentration of 8 to 10 PPM for 10 sec. The degree of contact was 14° in another comparative example in which the substrate was cleaned with only a 40 mmol/liter HCl solution for 10 sec. The degree of contact of a water droplet adhering to the cleaned substrate surface was 4° in example 2 in which the substrate was washed with the aqueous oxidizing acidic cleaning solution (i) for 10 sec.

It was understood from the above that a larger quantity of organic substance could be removed from the substrate surface in example 2, in which the substrate was washed with the aqueous cleaning solution (i), as compared with those of the comparative examples in which each substrate was washed with only ozone water or a HCl solution. In other words, the cleaning power of the aqueous cleaning solution (i) was stronger than that of ozone water or a HCl solution alone, and furthermore, the quantity of organic substance adhering to the substrate was reduced to a fifth of that adhering to the uncleaned substrate.

As is confirmed in the above examples 1 and 2, metallic contaminants and organic substances could be effectively removed according to the cleaning method using the aqueous oxidizing acidic cleaning solution (i), which fact means this method can be appropriately applied to cleaning substrates to which metallic contaminants and organic substances adhere. For example, in a process for manufacturing TFT, a resist layer is formed to selectively etch a Cr film from a substrate and then removed after etching. Both metallic atoms contained in an etching solution and organic substances, i. e., residues of the resist layer, can be effectively removed from the resulting substrate by washing with the aqueous cleaning solution (i).

Example 3

In this example, an aqueous reducing alkaline cleaning solution (ii) was used for washing. The aqueous cleaning solution (ii) was prepared by mixing 2 mmol/l ammonia water and a hydrogen water having a concentration of 1 to 2 PPM at a mixing ratio of 1 liter to 1 liter. Cleaning was carried out by jetting the aqueous cleaning solution (ii) on the surface a liquid crystal display substrate for 5 min.

As a comparative example, cleaning was conducted in a similar way using 2 mmol/l ammonia water alone for 5 min. Similarly, a hydrogen solution having a concentration of 1 to 2 PPM alone was used for cleaning in another comparative example.

The cleaning effect of each method was evaluated from the particle removal calculated from the number of particles adhering to the substrate surface. The scattering of laser light irradiating the substrate surface was measured using a light receptor to calculate the number of particles adhering to per 100 $cm^2$ of substrate surface.

<Effect on the Particle Removal>

The number of particles adhering to the uncleaned substrate surface was approximately 2,000/100 $cm^2$. The number was reduced to 1,200 to 1,300/100 $cm^2$ after cleaning the substrate with an ammonia water of 2 mmol/l in a comparative example. The number was 1,500 to 1,600/100 $cm^2$ after cleaning the substrate with a hydrogen solution having a concentration of 1 to 2 PPM in another comparative example. Meanwhile, the number was reduced to 100/100 $cm^2$ after cleaning the substrate with the aqueous cleaning solution (ii) prepared by mixing 2 mmol/l ammonia water and a hydrogen solution having a concentration of 1 to 2 PPM in example 3.

It was understood from the above that the method using the aqueous reducing alkaline cleaning solution (ii) was more effective in the particle removal such that a larger number of particles could be removed from the substrate surface as compared with that using a hydrogen substrate or ammonia water alone. Although the cleaning power of the aqueous cleaning solutions (i) and (ii) was investigated in the above examples 1 to 3, it was confirmed from similar experiments that strong cleaning effects could be also obtained by using the aqueous cleaning solutions (iii) and (iv).

Accordingly, the aqueous cleaning solution (i) can oxidize and remove organic substances by its oxidizing effect, and can also ionize and remove metallic contaminants due to its acidity. Therefore, the aqueous cleaning solution (i) can be appropriately applied to cleaning liquid crystal display substrates after a resist-forming step or an electrode-etching step.

Furthermore, extremely effective particle-removal can be expected for the aqueous cleaning solution (ii) because of its reducing property and alkalinity.

The aqueous cleaning solution (iii) can oxidize and remove organic substances by its strong oxidizing effect, and can also remove particles due to its alkalinity.

The aqueous cleaning solution (iv) can remove oxide films because of its strong reducing effect and acidity, and can also prevent oxide films from re-forming after cleaning. Therefore the aqueous cleaning solution (iv) is preferably used for cleaning subjects treated with dilute hydrofluoric acid. Although dilute hydrofluoric acid is used for removing oxide films spontaneously formed on the subject surfaces, oxide films readily re-formed, if the subjects are left as they are after the hydrofluoric acid treatment. The reappearance of oxide films is preventable by cleaning the subjects with the aqueous cleaning solution (iv) after the hydrofluoric acid treatment.

As mentioned above, in cleaning methods using one of the aqueous cleaning solutions (i) to (iv) of the present invention, a plurality of types of contaminants can be removed using only one type of aqueous cleaning solution because an appropriate cleaning effect can be obtained according to the types of contaminants adhering to subjects during each manufacturing step. Moreover, an aqueous cleaning solution with ORP and pH values appropriately adjusted for removal of each contaminant can readily be produced.

Figure 5:
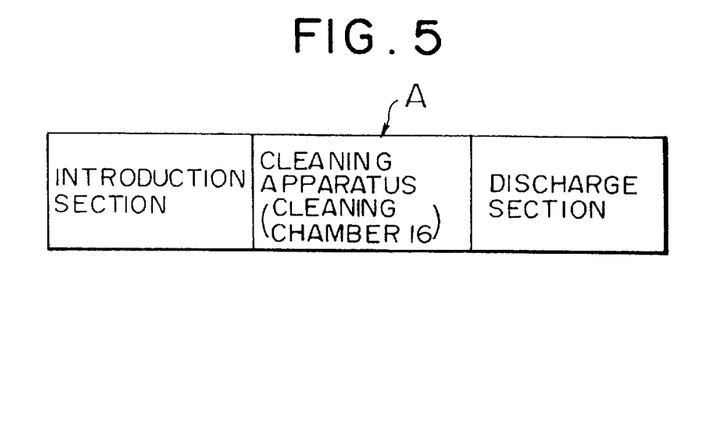
FIG. 5 shows a construction of equipment including the cleaning apparatus shown in FIG. 1A.

FIG. 5 shows the cleaning apparatus A shown in FIG. 1. As is shown in FIG. 5, the cleaning apparatus A has only one cleaning chamber 16 arranged between an introduction section and a discharge section. A subject is introduced into the cleaning chamber 16 from the introduction section and discharged from the discharge section after being cleaned in the cleaning chamber 16. The cleaning apparatus A can selectively produce the aqueous cleaning solutions (i) to (iv) in the section 1 shown in FIG. 1 and can selectively send the produced aqueous cleaning solution to the cleaning chamber 16. Therefore, cleaning procedures each using different types of aqueous cleaning solutions can be conducted using only one cleaning chamber 16.

Thus, an appropriate aqueous cleaning solution to be supplied to the cleaning chamber 16 is selected according to the type of contaminants adhering to the subject transferred to the chamber 16. Furthermore, two or more types of aqueous cleaning solutions may be used at separate times with respect to the subject sent to the chamber 16 so as to remove a plurality of types of contaminants.

Examples of cleaning methods in the cleaning chamber 16 are: a method of jetting the aqueous cleaning solution to a subject; a cleaning method in which the aqueous cleaning solution flows down a subject; and a method of jetting the aqueous cleaning solution to a subject while rotating the subject. These methods may be conducted in combination with ultrasonic-waves or ultraviolet irradiation. When using ultrasonic-waves, the aqueous cleaning solution is supplied to the cleaning chamber 16 after passing through a ultrasonic vibration device.

In addition, cleaning may be carried out as follows: after being washed with any of the aqueous cleaning solutions from (i) to (iv) in the cleaning chamber 16, the subject is washed with super-pure water alone, dried with nitrogen gas or the like, and then transferred to the discharge section. Subjects are cleaned with only super-pure water which is directly supplied from the super-pure water supplying apparatus 4 to the cleaning chamber 16, as is shown in FIG. 1.

Moreover, an air knife blowing down from a position above may be set up at a boundary between the cleaning chamber 16 and the discharge section so as to prevent the aqueous cleaning solution from entering into the discharge section from the cleaning chamber 16 and the air knife may also be used for drying subjects.

Figure 6A:
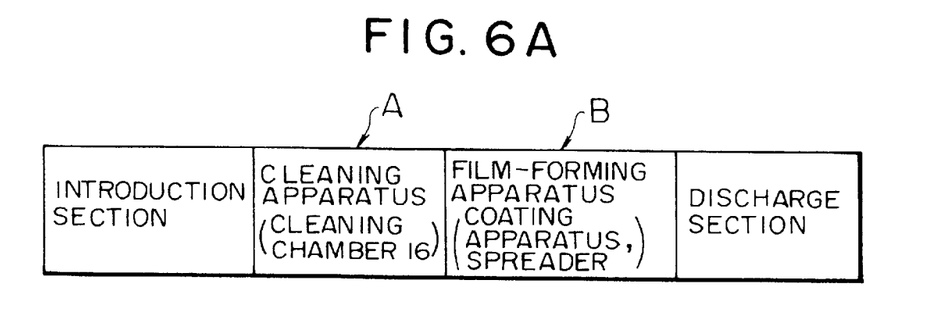
FIGS. 6A and 6B show constructions of equipment including the cleaning apparatus shown in FIG. 1A and other apparatuses.

Since cleaning procedures each using a different type of aqueous cleaning solution can be conducted by the cleaning apparatus A of the present invention, a processing apparatus B may be provided next to the cleaning chamber 16 as is shown in FIG. 6A. Examples of the processing apparatus B are a film-forming apparatus such as a sputtering or CVD apparatus, a coating apparatus for forming orientation films or resist layers, and a spreader for arranging spacers between liquid crystal display substrates.

Figure 6B:
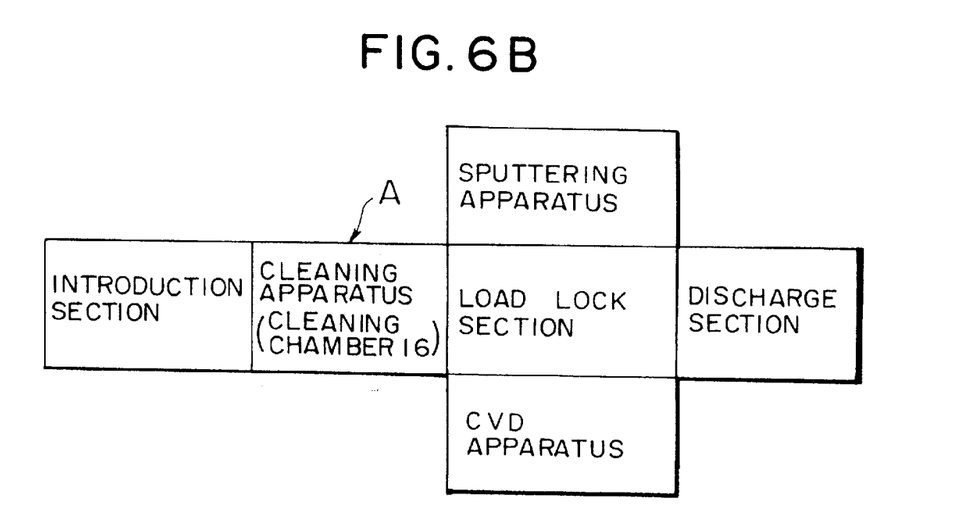

A chamber used as a load lock section may be arranged next to the cleaning chamber 16 as is shown in FIG. 6B. Connecting to the load lock section, chambers for a sputtering apparatus, a CVD apparatus, a coating apparatus, a spreader, and the like may be set up. In FIG. 6B, the following procedures can be continuously conducted: A substrate introduced from the introduction section is transferred to the cleaning chamber 16, washed with super-pure water or any one of the aqueous cleaning solutions (i) to (iv), and then sent to the load lock section. The substrate is then transferred to the sputtering apparatus for film forming by sputtering and re-transferred to the cleaning chamber 16 to be washed with any of the aqueous cleaning solutions. From the load lock section, the substrate is sent to the CVD apparatus for film-forming by CVD and re-transferred to the cleaning chamber 16 to be washed with one of the aqueous cleaning solutions.

As described above, according to a cleaning method and an apparatus of the present invention, contaminants adhering to a subject can be more effectively removed in a short period of time using a small quantity of aqueous cleaning solution as compared with cleaning methods and apparatuses employing super-pure water, because the aqueous oxidizing alkaline cleaning solution, the aqueous reducing acidic cleaning solution, the aqueous oxidizing acidic cleaning solution containing ozone water, and the aqueous reducing alkaline cleaning solution using hydrogen water which are employed in the present invention have stronger cleaning power.

Furthermore, since the pH and ORP of each aqueous cleaning solution can be separately controlled, an aqueous cleaning solution which has the strongest cleaning power without damaging a subject can be selectively produced according to the types of contaminants adhering to the subject during each step of manufacturing a substrate. Therefore, a plurality of contaminant types can be removed using only one type of aqueous cleaning solution, thereby reducing the number of cleaning chambers. Re-adherence of contaminants is preventable because of the shortened cleaning steps, and furthermore, cleaning apparatuses can be simplified.

As is mentioned in the above, according to the present invention, a plurality of types of contaminants can be removed using one type of aqueous cleaning solution. In addition, since the aqueous cleaning solutions exhibit strong cleaning power, subjects can be cleaned using small quantities of aqueous cleaning solutions. Moreover, cleaning apparatuses can be simplified. Therefore, the cost of manufacturing these subjects such as liquid crystal display substrates and electronic parts including ICs can be reduced.

What is claimed is:

1. A method for cleaning an object comprising:

providing a cleaning apparatus comprising:
- a device for forming an ozone gas;
- a device for forming a hydrogen gas;
- a mixing device for dissolving said ozone gas into pure water to produce ozone water;
- a mixing device for dissolving said hydrogen gas into pure water to produce hydrogen water;
- a mixing device for mixing one of a group consisting of an acidic solution and an alkaline solution with said ozone water to obtain an oxidizing cleaning solution;
- a mixing device for mixing one of a group consisting of an acidic solution and an alkaline solution with said hydrogen water to obtain a reducing cleaning solution;
- means for supplying at least one of said cleaning solutions to a subject to be cleaned;

producing said ozone gas and said hydrogen gas;

dissolving at least one of said ozone gas and said hydrogen gas into pure water to produce at least one of ozone water and hydrogen water;

selectively mixing at least one of said ozone water and said hydrogen water with at least one of the acidic solution and alkaline solution to produce at least one cleaning solution selected from the group consisting of an oxidizing acidic cleaning solution, an oxidizing alkaline cleaning solution, a reducing acidic cleaning solution, and a reducing alkaline cleaning solution; and cleaning the subject by supplying said at least one of said cleaning solutions to the subject.

2. The cleaning method of claim 1, further comprising dissolving said hydrogen gas into pure water to form hydrogen water, mixing the hydrogen water with said acidic solution thereby forming an acidic reducing cleaning solution and then cleaning a subject to be cleaned with the cleaning solution.

3. The cleaning method of claim 1, further comprising dissolving said hydrogen gas into pure water to form hydrogen water, mixing the hydrogen water with said alkaline solution thereby forming an alkaline reducing cleaning solution and then cleaning a subject to be cleaned with the cleaning solution.

4. The cleaning method of claim 2 further comprising first dissolving said ozone gas into pure water to form ozone water, mixing said ozone water with said acidic solution to form an oxidizing acidic cleaning solution and cleaning a subject to be cleaned with the cleaning solution and subsequently performing the acts of claim 2.

5. The cleaning method of claim 3 further comprising first dissolving said ozone gas into pure water to form ozone water, mixing said ozone water with said acidic solution to form an oxidizing acidic cleaning solution and cleaning a subject to be cleaned with the cleaning solution and subsequently performing the acts of claim 3.

6. The cleaning method of claim 2 further comprising first performing the acts of claim 2 and subsequently mixing said ozone water and said acidic solution, and cleaning the subject to be cleaned with the oxidizing acidic cleaning solution.

7. The cleaning method of claim 3 further comprising first performing the acts of claim 3 and subsequently mixing said ozone water and said acidic solution, and cleaning the subject to be cleaned with the oxidizing acidic cleaning solution.

* * * * *

UNITED STATES PATENT AND TRADEMARK OFFICE
CERTIFICATE OF CORRECTION

PATENT NO. : 6,039,815
DATED : March 21, 2000
INVENTOR(S) : Yeol et al

It is certified that error appears in the above-indentified patent and that said Letters Patent is hereby corrected as shown below:

On the title page: Item

"[73] Assignee:" change "Alps Electric Co., Ltd., Japan" to -- Frontec Incorporated and Organo Corporation, both of Tokyo, Japan --.

Signed and Sealed this

Thirteenth Day of March, 2001

Attest:

NICHOLAS P. GODICI

*Attesting Officer*   *Acting Director of the United States Patent and Trademark Office*